(12) United States Patent
Takeda et al.

(10) Patent No.: US 8,823,040 B2
(45) Date of Patent: Sep. 2, 2014

(54) LIGHT-EMITTING DEVICE AND METHOD OF MANUFACTURING THE SAME

(75) Inventors: Shigeo Takeda, Kiyosu (JP); Makoto Ishida, Kiyosu (JP); Mitsushi Terakami, Kiyosu (JP); Shota Yamamori, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 217 days.

(21) Appl. No.: 13/489,357

(22) Filed: Jun. 5, 2012

(65) Prior Publication Data

US 2013/0049061 A1 Feb. 28, 2013

(30) Foreign Application Priority Data

Aug. 24, 2011 (JP) ................. 2011-182612

(51) Int. Cl.
*H01L 33/00* (2010.01)
(52) U.S. Cl.
USPC 257/99; 257/100; 257/E33.058; 257/E33.059; 438/22; 438/26
(58) Field of Classification Search
CPC ....... H01L 33/62; H01L 33/486; H01L 33/54; H01L 33/56; H01L 33/58; H01L 33/483; H01L 33/52; H01L 33/005
USPC .............. 257/99, 100, E33.058, E33.059; 438/22, 26
See application file for complete search history.

(56) References Cited

U.S. PATENT DOCUMENTS

| 8,030,674 B2 * | 10/2011 | Hsu et al. ................. 257/98 |
| 2011/0233571 A1 * | 9/2011 | Park ........................ 257/88 |

FOREIGN PATENT DOCUMENTS

| JP | 2010-080503 A | 4/2010 |
| JP | 2011-066144 A | 3/2011 |

\* cited by examiner

*Primary Examiner* — Minh-Loan T Tran
(74) *Attorney, Agent, or Firm* — McGinn IP Law Group, PLLC

(57) ABSTRACT

A light-emitting device includes an element mounting substrate, a light-emitting element on the element mounting substrate, a case formed around the light-emitting element and having an opening on a light extraction side of the light-emitting device, and a sealing material filled in the opening of the case to seal the light-emitting element. The element mounting substrate includes an uneven portion configured to firmly attach the element mounting substrate to the case or the sealing material.

20 Claims, 6 Drawing Sheets

LIGHT-EMITTING DEVICE AND METHOD OF MANUFACTURING THE SAME

The present application is based on Japanese patent application No. 2011-82612 filed on Aug. 24, 2011, the entire contents of which are incorporated herein by reference.

BACKGROUND OF THE INVENTION

1. Field of the Invention

The invention relates to a light-emitting device in which a light-emitting element is mounted on an element mounting portion, and a method of manufacturing the light-emitting element.

2. Related Art

In recent years, high-power light emitting diode (LED) element have been developed and high-power type LED elements of which power consumption is several watts have been already commercialized. Although the LED element is characterized by less heat generation, a large electric current is flowing in a high-power type LED element and a considerable level of heat is thus generated therein.

Accordingly, in a light-emitting device, for example, a back surface of a lead frame for mounting an LED element is exposed to the outside so that heat generated by the LED element is effectively dissipated from the portion exposed to the outside, thereby ensuring reliability thereof.

Conventionally, this type of light-emitting device is known, which is provided with a lead frame having an element mounting portion and wire connecting portions, an LED element mounted on the element mounting portion of the lead frame and connected to the wire connecting portions by wires, a resin case for housing the LED element, and a sealing material filled in the resin case to seal the LED element and the wires (e.g., JP-A-2011-66144).

For manufacturing such a light-emitting device, a resin case is formed on a lead frame, an LED element is then mounted on an element mounting portion of the lead frame in the resin case, and subsequently, the LED element is connected to wire connecting portions of the lead frame by wires and a resin material as a sealing material is then injected into the resin case to seal the LED element and the wires.

SUMMARY OF THE INVENTION

In the meantime, in the light-emitting device described above, uneven portions (i.e., concave and convex portions) are formed between the lead frame and the resin case in order to prevent the lead frame from being separated from the resin case. In this case, a concave portion is provided on a surface (top surface) of the lead frame by etching at a position on which the resin case is to be formed, and a convex portion is provided on the resin case by fitting the resin material of the resin case in the concave portion, thereby forming the uneven portions.

However, the light-emitting device described in JP-A-2011-66144 has a problem that it is not possible to suppress separation of the sealing material from the lead frame even though an effect of suppressing separation of the resin case from the lead frame can be expected.

Therefore, it is an object of the invention to provide a light-emitting device in which it is possible to suppress separation of a case and a sealing material from an element mounting substrate, and a method of manufacturing the same.

(1) According to one embodiment of the invention, a light-emitting device comprises:
   an element mounting substrate;
   a light-emitting element on the element mounting substrate;
   a case formed around the light-emitting element and having an opening on a light extraction side of the light-emitting element; and
   a sealing material filled in the opening of the case to seal the light-emitting element,
   wherein the element mounting substrate comprises an uneven portion configured to firmly attach the element mounting substrate to the case or the sealing material.

In the above embodiment (1) of the invention, the following modifications and changes can be made.
   (i) The uneven portion is formed on a top surface and a side surface of the element mounting substrate opposite to the case and on the top surface opposite to the sealing material.
   (ii) The uneven portion comprises a convex portion formed on the side surface of the element mounting substrate by etching both the top surface and a back surface of the element mounting substrate.
   (iii) The uneven portion comprises a concave portion formed on the side surface of the element mounting substrate by etching a back surface of the element mounting substrate.

(2) According to another embodiment of the invention, a method of manufacturing a light-emitting device comprises:
   forming an uneven portion on an element mounting substrate;
   forming a case having an opening on an element mounting surface side of the element mounting substrate;
   mounting a light-emitting element on the element mounting substrate and in the opening of the case;
   filling a sealing material in the opening of the case to seal the light-emitting element and to firmly attach the sealing material to the element mounting substrate by the uneven portion.

In the above embodiment (2) of the invention, the following modifications and changes can be made.
   (iv) The forming of the uneven portion on the element mounting substrate is conducted simultaneously with the formation of the case on the element mounting substrate.

Points of the Invention

According to one embodiment of the invention, a light-emitting device is constructed such that when a case is formed on an element mounting substrate, a concave portion of the element mounting substrate is firmly attached to a convex portion of the case and a convex portion of the element mounting substrate is firmly attached to the concave portion of the case, so that a so-called anchor effect can be obtained between the element mounting substrate and the case. Moreover, when a sealing material is filled in the case to seal an LED element, a concave portion of the element mounting substrate opposite to the sealing material is firmly attached to a convex portion of the sealing material, so that a so-called anchor effect can be obtained between the element mounting substrate and the sealing material.

BRIEF DESCRIPTION OF THE DRAWINGS

Next, the present invention will be explained in more detail in conjunction with appended drawings, wherein:

FIGS. 2A and 2B are diagrams illustrating an element mounting substrate of the light-emitting device in the first embodiment of the invention, wherein FIG. 2A is a plan view and FIG. 2B is a cross sectional view;

FIGS. 4A to 4E are cross sectional views for explaining a method of manufacturing a light-emitting device in the first embodiment of the invention, wherein FIG. 4A shows a case forming step, FIG. 4B shows a plating step, FIG. 4C shows an LED element mounting step, FIG. 4D shows a wire-bonding step and FIG. 4E shows a sealing step;

FIGS. 6A and 6B are cross sectional views showing a substrate material of the element mounting substrate of the light-emitting device in the second embodiment of the invention and a modification thereof, wherein FIG. 6A shows the second embodiment and FIG. 6B shows the modification.

DESCRIPTION OF THE PREFERRED OF EMBODIMENTS

First Embodiment

A light-emitting device and a method of manufacturing the light-emitting device in a first embodiment of the invention will be described in detail in reference to the drawings.

Overall Structure of Light-Emitting Device

Figure 1:
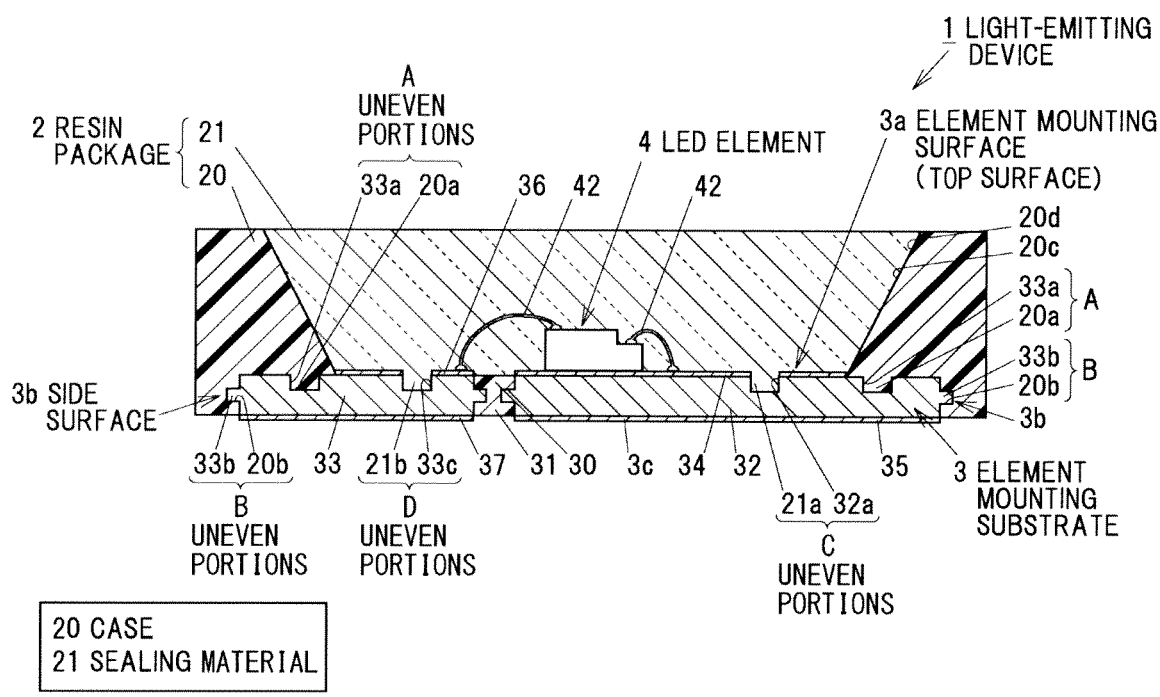
FIG. 1 is a cross sectional view showing a light-emitting device in a first embodiment of the present invention.
Figure 2A:
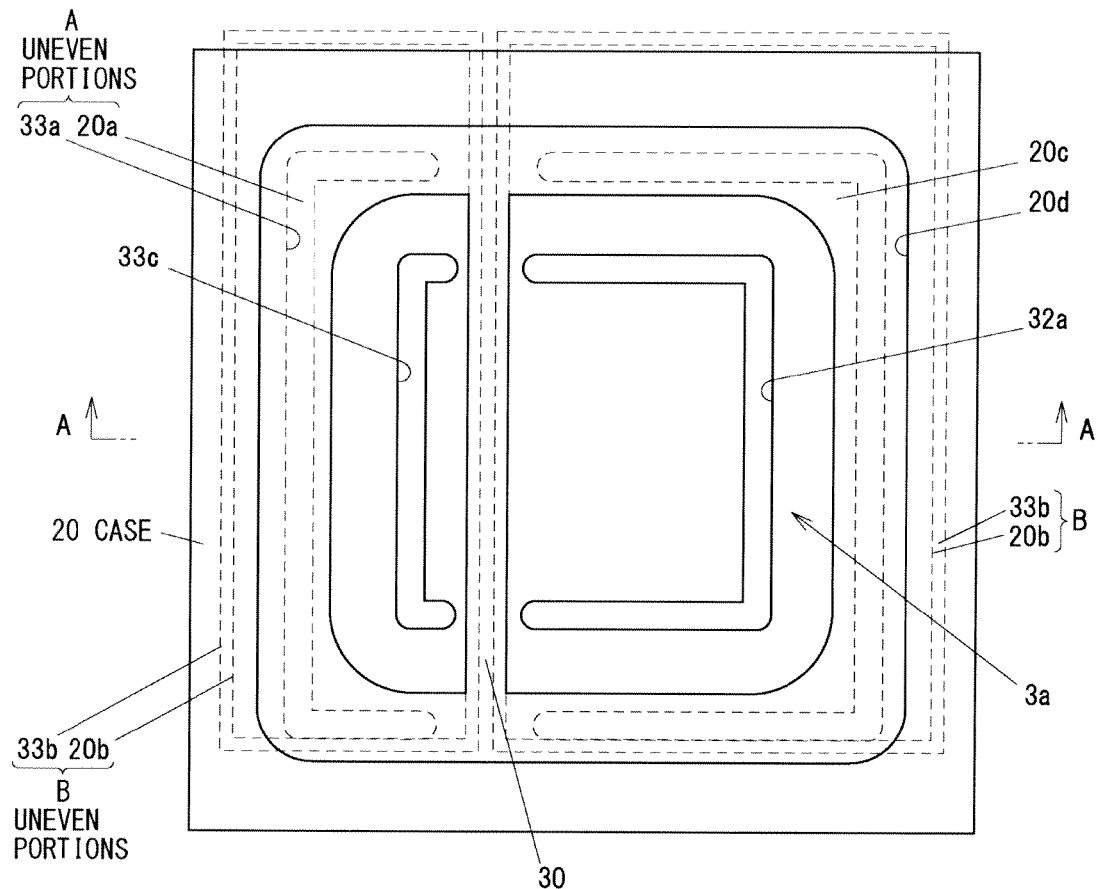
Figure 2B:
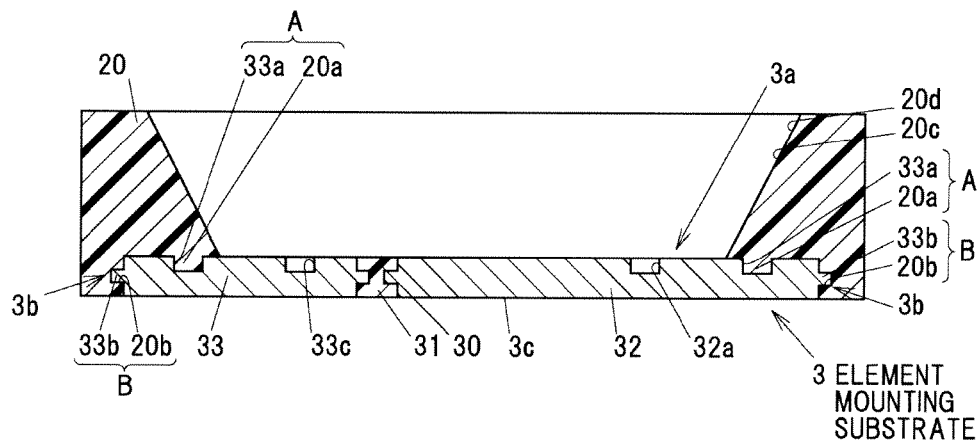

FIG. 1 shows a light-emitting device. FIGS. 2A and 2B show a case and an element mounting substrate. As shown in FIGS. 1, 2A and 2B, a light-emitting device 1 is generally composed of a resin package 2, an element mounting substrate 3 on which the resin package 2 is formed on an element mounting surface (top surface) 3a side, and an LED element 4 mounted on the element mounting substrate 3.

Structure of Resin Package 2

The resin package 2 has a case 20 and a sealing material 21, and is arranged from the top surface 3a to a side surface 3b of the element mounting substrate 3. For example, thermoplastic resins such as polyamide, thermoset resins such as epoxy or silicone, or ceramics such as alumina which block light are used as a material of the resin package 2. A silicone resin is used in the present embodiment.

The case 20 opens toward the light extraction side, is arranged on the top surface 3a (edge portion) and the side surface 3b of the element mounting substrate 3, and is formed entirely of a frame member having a substantially square outline in a plan view. An element-side opening of the case 20 is blocked by the element mounting substrate 3. In addition, on the case 20, a convex portion 20a having a substantially U-shape in a plan view is formed at a portion firmly attached to the top surface 3a of the element mounting substrate 3 and a concave portion 20b having a substantially U-shape in a plan view is formed at a portion firmly attached to the side surface 3b of the element mounting substrate 3.

A housing space 20c in a substantially truncated square pyramid shape for housing the LED element 4 is formed in the case 20. The housing space 20c is configured to have an opening area gradually increasing from the top surface 3a of the element mounting substrate 3 toward a case opening 20d. Accordingly, air bubbles generated in the housing space 20c at the time of manufacturing the light-emitting device 1 (sealing the LED element 4) is facilitated to move along the inner surface of the case 20 from the element mounting surface 3a of the element mounting substrate 3 toward the case opening 20d and is then released to the outside of the case 20.

The sealing material 21 is firmly attached to the top surface 3a of the element mounting substrate 3 and fills the case 20. The sealing material 21 is configured to seal the LED element 4 and wires 42 on the element mounting substrate 3. In addition, convex portions 21a and 21b having a substantially U-shape in a plan view are formed on the sealing material 21 at portions firmly attached to the top surface 3a of the element mounting substrate 3. As a material of the sealing material 21, a silicone-based light transmitting resin is used, and alternatively, e.g., an acrylic-based light transmitting resin may be used.

Structure of Element Mounting Substrate 3

The element mounting substrate 3 has a pair of contact pads 32, 33 which are insulated from each other by a first insulating member 30 and a second insulating member 31, and the entire element mounting substrate 3 is formed of a plate member having a rectangular shape in a plan view. Thickness of the element mounting substrate 3 is set to about 1.0 mm. Uneven portions A (or concave portions A) and uneven portions B (or convex portions B) respectively firmly attached to each other are arranged between the element mounting substrate 3 and the case 20, and an uneven portion C (or concave portion C) and uneven portion D (or concave portion D) respectively firmly attached to each other are arranged between the element mounting substrate 3 and the sealing material 21.

In the present embodiment, a concave portion 33a having a substantially U-shape in a plan view which is firmly attached to the convex portion 20a of the case 20 is formed on the top surface 3a of the element mounting substrate 3 (the surfaces of the contact pads 32 and 33), the uneven portions A are thus arranged between the element mounting substrate 3 and the case 20. A convex portion 33b having a substantially U-shape in a plan view which is firmly attached to the concave portion 20b of the case 20 is formed on the side surface 3b of the element mounting substrate 3 (the side surfaces of the contact pads 32 and 33), and the uneven portions B are thus arranged between the element mounting substrate 3 and the case 20. A concave portion 32a having a substantially U-shape in a plan view which is firmly attached to the convex portion 21a of the sealing material 21 is formed on the top surface 3a of the element mounting substrate 3 (the surface of the contact pad 32), and the uneven portion C is thus arranged between the element mounting substrate 3 and the sealing material 21. A concave portion 33c having a substantially U-shape in a plan view which is firmly attached to the convex portion 21b of the sealing material 21 is formed on the top surface 3a of the element mounting substrate 3 (the surface of the contact pad 33), and the uneven portion D is thus arranged between the element mounting substrate 3 and the sealing material 21. The concave portions 33a, 33c and 32a are formed by etching the top surface 3a of the element mounting substrate 3 and the convex portion 33b is formed by etching the top surface 3a and a back surface 3c of the element mounting substrate 3.

The first insulating member 30 is arranged on one side (element mounting side) of the element mounting substrate 3 and the second insulating member 31 is arranged on another side (non-element mounting side) of the element mounting substrate 3. The same material as the resin package 2 (silicone resin) is used as a material of the first insulating member 30 and the second insulating member 31.

The pair of contact pads 32, 33 is arranged so as to be adjacent to each other via the first insulating member 30 and the second insulating member 31 and in parallel to each other in a surface direction of the element mounting substrate 3. The contact pad 32 is an element mounting/wire connecting pad while the contact pad 33 is a wire connecting pad.

On top and back surfaces of the contact pad 32, plated portions 34 and 35 are provided by plating, e.g., silver (Ag), etc. On top and back surfaces of the contact pad 33, plated portions 36 and 37 are provided by plating, e.g., Ag, etc., in the same manner as the contact pad 32. An n-side electrode 41 (described later) of the LED element 4 is connected to the surface of the contact pad 32 via the plated portion 34 and a p-side pad electrode 40a (described later) of the LED element 4 is connected to the surface of the contact pad 33 via the plated portion 36. Power-supply voltage is supplied to the LED element 4 from the back surface of the contact pad 32 via the plated portion 35 and the back surface of the contact pad 33 via the plated portion 37. Metals made of, e.g., copper alloy or iron alloy are used as a material of the pair of contact pads 32, 33.

For forming the element mounting substrate 3, a first concave portion is formed on a metal plate (copper alloy or iron alloy) as a substrate material (not shown) having the concave portions 32a, 33a, 33c and the convex portion 33b preliminarily formed thereon by etching a top surface thereof, the first insulating member 30 is filled in the first concave portion by screen printing, and subsequently, a second concave portion is formed on the metal plate by etching a back surface thereof and the second insulating member 31 is filled in the second concave portion by screen printing. In this case, the first and second concave portions are adjacent in a thickness direction of the substrate material and are formed as holes with two different opening widths having a substantially T-shaped cross section.

Structure of LED Element 4

Figure 3:
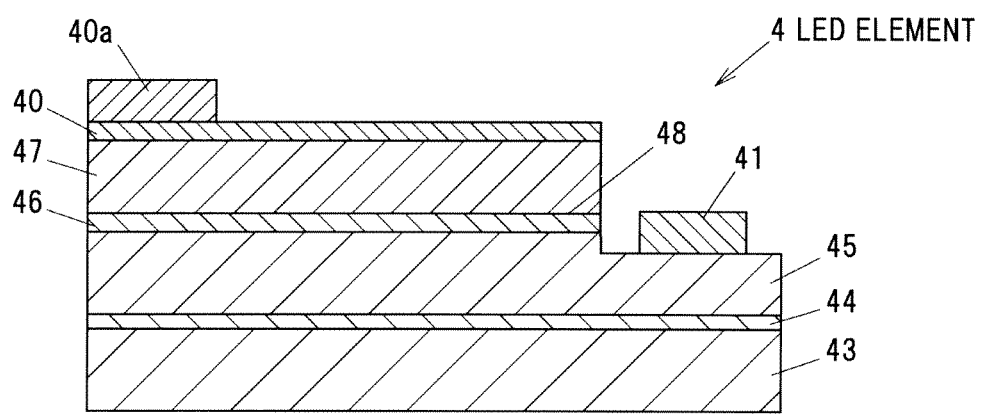
FIG. 3 is a cross sectional view showing an LED element of the light-emitting device in the first embodiment of the invention.

FIG. 3 shows an LED element. As shown in FIG. 3, the LED element 4 has a p-side electrode 40 and an n-side electrode 41, and is mounted at substantially the center of the element mounting surface 3a of the element mounting substrate 3 (shown in FIG. 1) by respectively connecting the p-side electrode 40 (the p-side pad electrode 40a) to the plated portion 36 (shown in FIG. 1) and the n-side electrode 41 to the plated portion 34 (shown in FIG. 1) using the wires 42 (shown in FIG. 1). As the LED element 4, for example, a blue LED element having a substantially square shape in a plan view is used.

In addition, the LED element 4 has a buffer layer 44, an n-type semiconductor layer 45, a MQW (Multiple Quantum Well) layer 46 as a light-emitting layer and a p-type semiconductor layer 47 formed in this order by epitaxially growing a group III nitride-based semiconductor on a surface of a sapphire ($Al_2O_3$) substrate 43 at, e.g., a temperature of 700° C. and is configured so that blue light having a peak emission wavelength of, e.g., 460 nm to 463 nm is emitted from a light-emitting face 48.

The p-side electrode 40 has the p-side pad electrode 40a and is provided on a surface of the p-type semiconductor layer 47. The n-side electrode 41 is provided on a portion (of the n-type semiconductor layer 45) exposed by partially etching from the p-type semiconductor layer 47, the MQW layer 46 to the n-type semiconductor layer 45. A transparent conductive member made of oxide such as, e.g., ITO (Indium Tin Oxide) is used as a material of the p-side electrode 40 and a metal such as, e.g., Ni/Au or Al is used as a material of the p-side pad electrode 40a and the n-side electrode 41.

Method of Manufacturing Light-Emitting Device 1

Next, a method of manufacturing the light-emitting device 1 in the present embodiment will be described in reference to FIGS. 4A to 4E. FIGS. 4A to 4E show a manufacturing procedure of a light-emitting device.

In the method of manufacturing a light-emitting device in the present embodiment, steps of "case formation", "plating process", "LED element mounting", "wire bonding" and "LED element sealing" are sequentially performed, and accordingly, each step is sequentially explained.

Case Formation

Figure 4:
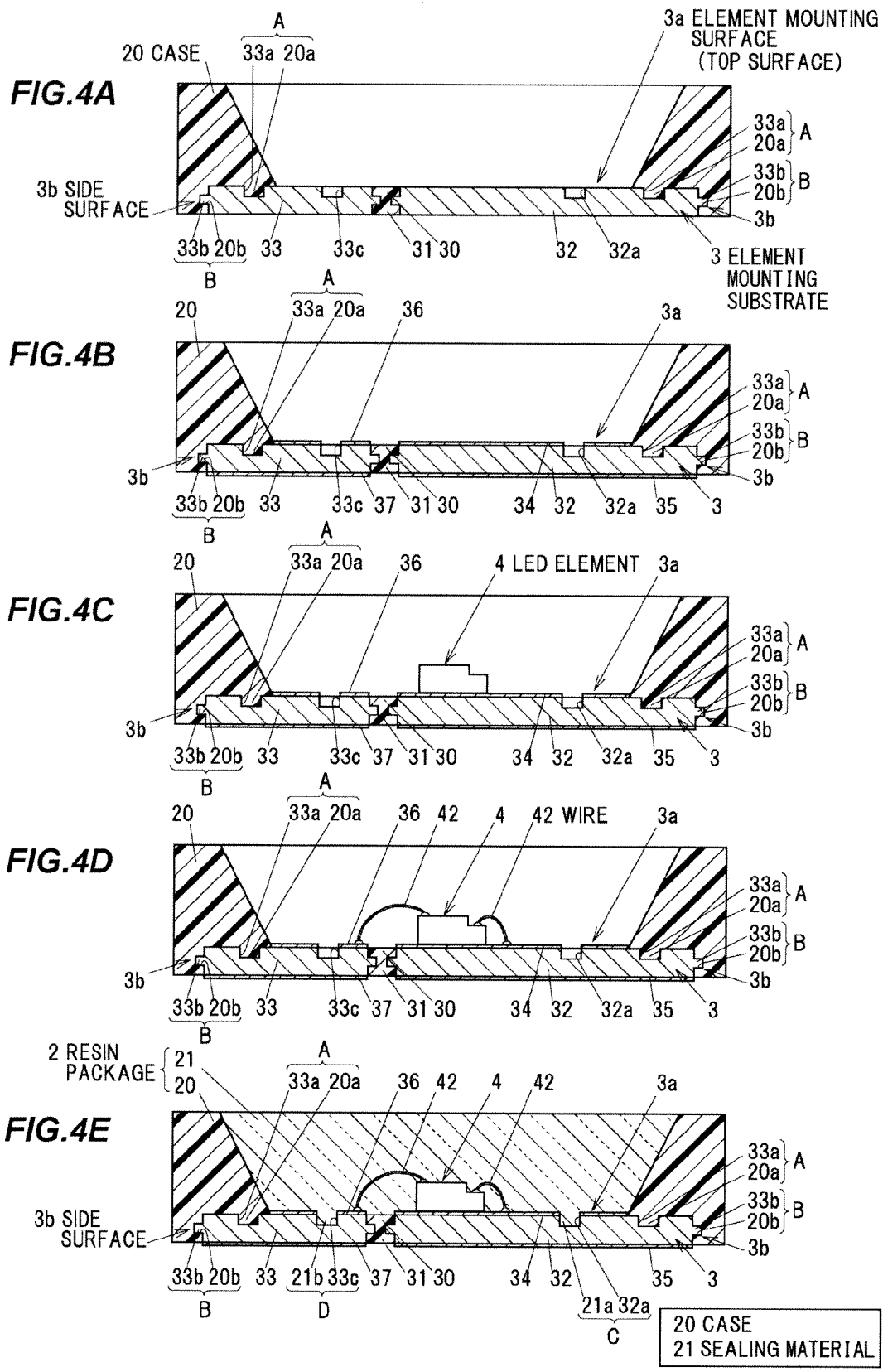

As shown in FIG. 4A, a liquid resin to be the case 20 is injected and cured in a mold (not shown) in which the element mounting substrate 3 is preliminarily placed, thereby forming the case 20 on the top surface 3a and the side surface 3b of the element mounting substrate 3. Then, after forming the case 20, a resin burr left between the element-side opening thereof and the top surface 3a of the element mounting substrate 3 is removed by dissolving with an alkaline solution or by blowing silica ($SiO_2$) against it.

In the present embodiment, once the case 20 is formed on the element mounting substrate 3, the concave portion 33a of the element mounting substrate 3 is firmly attached to the convex portion 20a of the case 20 and the convex portion 33b of the element mounting substrate 3 is firmly attached to the concave portion 20b of the case 20, and a so-called anchor effect is thereby obtained between the element mounting substrate 3 and the case 20. Particularly, the convex portion 33b of the element mounting substrate 3 is strongly attached to the concave portion 20b of the case 20 since the adhesion provides a function of engaging the case 20 with the element mounting substrate 3 in a thickness direction thereof.

It is possible to simultaneously form the case 20 and the element mounting substrate 3 by injecting a liquid resin in a dedicated mold in which a substrate material having the concave portions 32a, 33a, the convex portion 33b, a first concave portion to be filled with the first insulating member 30 and a second concave portion to be filled with the second insulating member 31 preliminarily formed thereon is placed.

Plating Process

As shown in FIG. 4B, the plated portions 34 and 35 are formed by performing a plating process on the top and back surfaces of the contact pad 32 of the element mounting substrate 3. Likewise, the plated portions 36 and 37 are formed by performing a plating process on the top and back surfaces of the contact pad 33 of the element mounting substrate 3.

LED Element Mounting

As shown in FIG. 4C, the LED element 4 is bonded to the contact pad 32 of the element mounting substrate 3 via the plated portion 34 using, e.g., an insulating adhesive (not shown) such as epoxy resin. At this time, the LED element 4 is bonded so that the p-side pad electrode 40a and the n-side electrode 41 (both shown in FIG. 3) face toward the light extraction side thereof. As a result, the LED element 4 is mounted on the element mounting substrate 3 (so-called face-up mounting).

Wire Bonding

As shown in FIG. 4D, the LED element 4 is connected to the plated portion 34 on the contact pad 32 and to the plated portion 36 on the contact pad 33 by the wires 42 using, e.g., a conductive adhesive containing silver powder. In this case, respectively via the wires 42, the p-side pad electrode 40a is connected to the plated portion 36 and the n-side electrode 41 is connected to the plated portion 34.

LED Element Sealing

As shown in FIG. 4E, a silicone-based liquid resin to be the sealing material 21 is injected into the case 20 using, e.g., a dispenser (not shown) and is then solidified. As a result, the LED element 4 on the element mounting substrate 3, together with the wires 42, is sealed with the sealing material 21. In this case, when sealing of the LED element 4 is completed, the resin package 2 is formed on the element mounting substrate 3 on the top surface 3a side. Since the concave portion 32a of the element mounting substrate 3 is firmly attached to the convex portion 21*a* of the sealing material 21 and the concave portion 33*c* of the element mounting substrate 3 is firmly attached to the convex portion 21*b* of the sealing material 21, a so-called anchor effect is obtained between the element mounting substrate 3 and the sealing material 21.

Although the case of manufacturing a single light-emitting device 1 has been described in the embodiment, the invention is not limited thereto and it is possible to manufacture plural light-emitting devices by using an element group mounting substrate having plural element mounting portions. In this case, a "dicing" step of cutting the case and the element group mounting substrate to divide into plural light-emitting devices is added after the "LED element sealing" step.

Effects of the First Embodiment

The following effects are obtained by the first embodiment described above.

It is possible to suppress separation of the case 20 and the sealing material 21 from the element mounting substrate 3.

Second Embodiment

Figure 5:
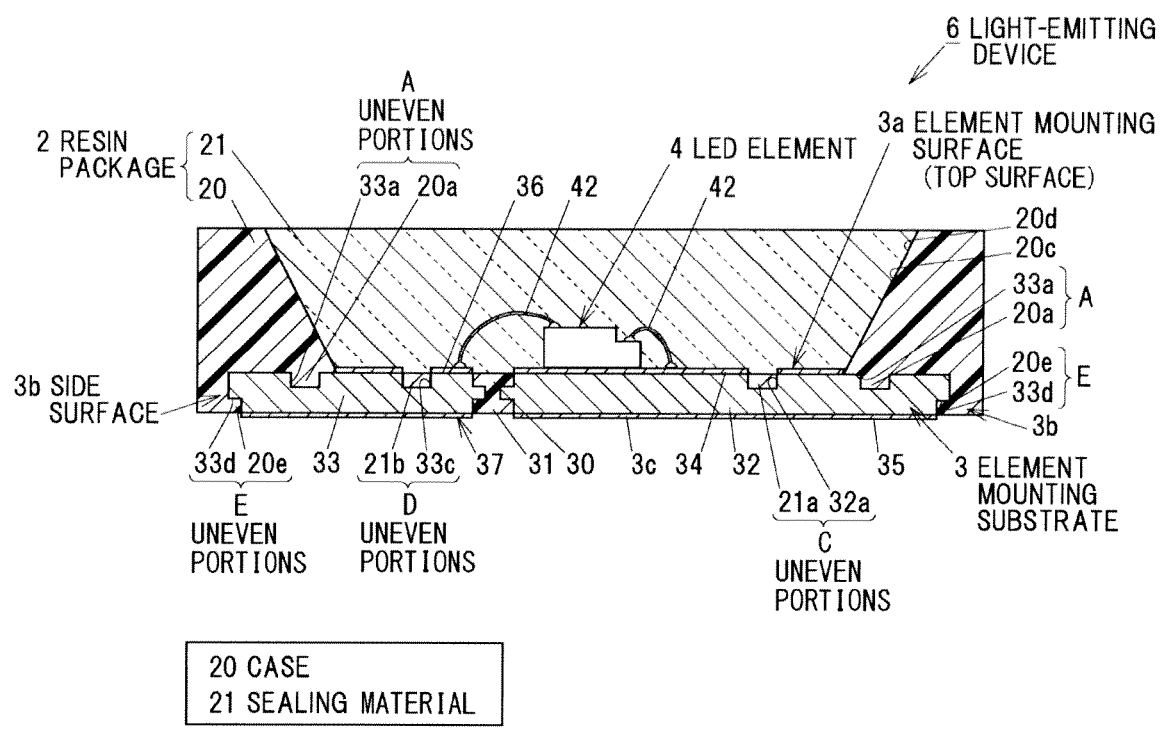
FIG. 5 is a cross sectional view showing a light-emitting device in a second embodiment of the invention.
Figure 6A:
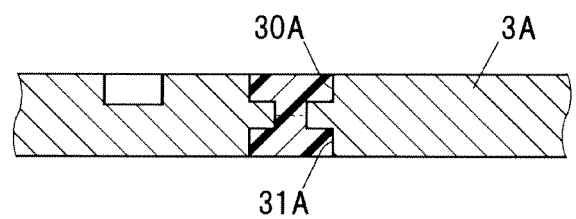
Figure 6B:
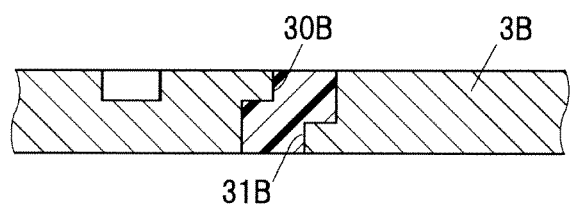

Next, an element group mounting substrate in a second embodiment of the invention will be described using FIGS. 5 to 6B. FIG. 5 shows a light-emitting device. FIGS. 6A and 6B show substrate materials. In FIG. 5, members which are the same as or equivalent to those in FIGS. 1 to 3 are denoted by the same reference numerals and the explanations thereof will be omitted.

As shown in FIG. 5, a light-emitting device 6 in the second embodiment of the invention is characterized in that a concave portion 33*d* to be firmly attached to a convex portion 20*e* of the case 20 is formed on the side surface 3*b* of the element mounting substrate 3 (the side surfaces of the contact pads 32 and 33), and uneven portions E are thus between the element mounting substrate 3 and the case 20.

That is, the concave portion 33*d* is formed as a notch on the side surface 3*b* by etching the back surface 3*c* of the element mounting substrate 3.

In the present embodiment, once the case 20 is formed on the element mounting substrate 3, the concave portion 33*d* of the element mounting substrate 3 and the convex portion 20*e* of the case 20 are firmly attached to each other and a so-called anchor effect is thereby obtained between the element mounting substrate 3 and the case 20. The adhesion is very strong to provide a function of engaging the case 20 with the element mounting substrate 3 in a thickness direction thereof (on the light extraction side).

Although, in the present embodiment, it has been explained that a first concave portion 30A and a second concave portion 31A preliminarily formed on a substrate material 3A are adjacent in a thickness direction of the substrate material 3A and are formed as holes with two different opening widths having a substantially T-shaped cross section as shown in FIG. 6A, the invention is not limited thereto. A first concave portion 30B and a second concave portion 31B, which are adjacent in a surface direction as well as a thickness direction of a substrate material 3B and are formed as holes with a uniform opening width having a rectangular cross section as shown in FIG. 6B, may be formed.

Effects of the Second Embodiment

The same effects as the first embodiment are obtained in the second embodiment described above.

Although the light-emitting device and the method of manufacturing the same of the invention have been described based on the embodiments, the invention is not intended to be limited thereto and the various kinds of embodiments can be implemented without departing from the gist of the invention. For example, the following modification can be made.

(1) Although the case where the LED element 4 is "face-up mounted" and is connected to the contact pads 32, 33 by the wires 42 has been described in the embodiments, the invention is not limited thereto. The LED element 4 may be "face-down mounted" and connected to the contact pads 32, 33 by metal bumps, etc.

(2) Although the embodiments are designed for the light-emitting device 1 having a single LED element 4, the invention is not limited thereto. A light-emitting device having plural LED elements may be implemented.

What is claimed is:

1. A light-emitting device, comprising:
    an element mounting substrate;
    a light-emitting element on the element mounting substrate;
    a case formed around the light-emitting element and having an opening on a light extraction side of the light-emitting element; and
    a sealing material filled in the opening of the case to seal the light-emitting element,
    wherein the element mounting substrate comprises a plurality of uneven portions configured to firmly attach the element mounting substrate to the case or the sealing material,
    wherein a first uneven portion of the plurality of uneven portions is formed on a side surface of the element mounting substrate between the case and the element mounting substrate.

2. The light-emitting device according to claim 1, wherein the plurality of uneven portions are formed on a top surface and the side surface of the element mounting substrate opposite to the case and on the top surface opposite to the sealing material.

3. The light-emitting device according to claim 2, wherein the plurality of uneven portions comprise a convex portion formed on the side surface of the element mounting substrate by etching both the top surface and a back surface of the element mounting substrate.

4. The light-emitting device according to claim 2, wherein the plurality of uneven portions comprise a concave portion formed on the side surface of the element mounting substrate by etching a back surface of the element mounting substrate.

5. The light-emitting device according to claim 1, wherein the case is formed of a frame member having a substantially square outline in a plan view.

6. The light-emitting device according to claim 1, wherein an opening area of the opening increases from a top surface of the element mounting substrate to the opening of the case.

7. The light-emitting device according to claim 1, wherein the sealing material comprises a silicone-based light transmitting resin.

8. A method of manufacturing a light-emitting device, comprising:
    forming a plurality of uneven portions on an element mounting substrate;
    forming a case having an opening on an element mounting surface side of the element mounting substrate;
    mounting a light-emitting element on the element mounting substrate and in the opening of the case;
    filling a sealing material in the opening of the case to seal the light-emitting element and to firmly attach the sealing material to the element mounting substrate by the plurality of uneven portions, wherein a first uneven portion of the plurality of uneven portions is formed on a side surface of the element mounting substrate between the case and the element mounting substrate.

9. The method according to claim 8, wherein the forming of the plurality of uneven portions on the element mounting substrate is conducted simultaneously with the formation of the case on the element mounting substrate.

10. The light-emitting device according to claim 8, wherein a second uneven portion is formed on a top surface of the element mounting substrate between the case and the element mounting substrate.

11. The light-emitting device according to claim 8, wherein the plurality of uneven portions have a substantially U-shape in a plan view.

12. A light-emitting device, comprising:
an element mounting substrate;
a light-emitting element on the element mounting substrate;
a case formed around the light-emitting element and having an opening on a light extraction side of the light-emitting element; and
a sealing material filled in the opening of the case to seal the light-emitting element,
wherein the element mounting substrate comprises a plurality of uneven portions configured to attach the element mounting substrate to at least one of the case and the sealing material,
wherein a first uneven portion of the plurality of uneven portions comprises a convex portion formed on a side surface of the element mounting substrate between the case and the element mounting substrate, and
wherein a second uneven portion of the plurality of uneven portions comprises a concave portion formed on a top surface of the element mounting substrate between the case and the element mounting substrate.

13. The light-emitting device according to claim 1, wherein a second uneven portion is formed on a top surface of the element mounting substrate between the case and the element mounting substrate.

14. The light-emitting device according to claim 13, wherein the second uneven portion has a U-shape in a plan view.

15. The light-emitting device according to claim 1, wherein a third uneven portion is formed on a top surface of the element mounting substrate between the sealing material and the element mounting substrate.

16. The light-emitting device according to claim 1, wherein the first uneven portion comprises a convex portion formed by etching both the top surface and a back surface of the element mounting substrate.

17. The light-emitting device according to claim 1, wherein the element mounting substrate has a pair of contact pads which are insulated from each other by a first insulating member and a second insulating member, and
wherein the element mounting substrate is formed of a plate member having a rectangular shape in a plan view.

18. The light-emitting device according to claim 17, wherein the first insulating member is arranged on an element mounting side of the element mounting substrate, and
wherein the second insulating member is arranged on a non-element mounting side of the element mounting substrate.

19. The light-emitting device according to claim 17, wherein the pair of contact pads are arranged so as to be adjacent to each other via the first insulating member and the second insulating member.

20. The light-emitting device according to claim 17, wherein the pair of contact pads are arranged so as to be in parallel to each other in a surface direction of the element mounting substrate.

* * * * *